(12) United States Patent
Maki et al.

(10) Patent No.: US 7,535,062 B2
(45) Date of Patent: May 19, 2009

(54) SEMICONDUCTOR DEVICE HAVING SOI STRUCTURE

(75) Inventors: Yukio Maki, Tokyo (JP); Takashi Ipposhi, Tokyo (JP); Toshiaki Iwamatsu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/619,874

(22) Filed: Jan. 4, 2007

(65) Prior Publication Data

US 2007/0158691 A1 Jul. 12, 2007

(30) Foreign Application Priority Data

Jan. 10, 2006 (JP) ............................. 2006-002222

(51) Int. Cl.
*H01L 27/01* (2006.01)
(52) U.S. Cl. .................. 257/347; 257/E27.112; 438/149
(58) Field of Classification Search ............... 257/213, 257/288, 347, 350, 355, 356, E27.009, E27.111, 257/E27.112; 438/142, 149, 307, 424
See application file for complete search history.

(56) References Cited

U.S. PATENT DOCUMENTS

| | | | | |
|---|---|---|---|---|
| 5,238,873 A | * | 8/1993 | Higashizono et al. | 438/453 |
| 5,478,762 A | * | 12/1995 | Chao | 438/143 |
| 2006/0048809 A1 | * | 3/2006 | Onvural | 136/212 |
| 2007/0115606 A1 | * | 5/2007 | DeVries et al. | 361/220 |

FOREIGN PATENT DOCUMENTS

| | | |
|---|---|---|
| JP | 2001-28438 | 1/2001 |
| JP | 2001-44441 | 2/2001 |

* cited by examiner

*Primary Examiner*—Evan Pert
*Assistant Examiner*—Kevin Quinto
(74) *Attorney, Agent, or Firm*—Oblon, Spivak, McClelland, Maier & Neustadt, P.C.

(57) ABSTRACT

A plurality of conductive layers and a plurality of wiring layers connecting a supporting substrate having SOI structure and uppermost wire are formed along a peripheral part of a semiconductor chip together with the uppermost wire, to thereby surround a transistor forming region in which a transistor is to be formed.

6 Claims, 26 Drawing Sheets

SEMICONDUCTOR DEVICE HAVING SOI STRUCTURE

BACKGROUND OF THE INVENTION

1. Field of the Invention

The present invention relates to a supporting-substrate contact technique in a semiconductor device having SOI structure.

2. Description of the Background Art

In a SOI structure, a device is formed in a SOI layer on a BOX oxide film. Hence, a contact needs to be formed to reach a supporting substrate so as to fix the substrate potential (cf. Japanese Patent Application Laid-Open No. 2001-28438 or 2001-44441).

On the other hand, a mounting technique of semiconductor components has been developed into a flip-chip (FC) technique of mounting a bare semiconductor chip directly on a substrate. When applying such FC technique to a semiconductor chip having SOI structure, the rear surface of the semiconductor chip, i.e., the bottom of a supporting substrate in the SOI structure is present on the front surface side to be exposed (that is, the front surface of the semiconductor chip is positioned on the rear side), which arises the need to fix the potential of the supporting substrate to a ground potential. However, various structures presented by conventional techniques are not intended to cope with such case, which are thus not applicable to such mounting.

Further, the SOI structure tends to be increased in contact resistance with size reduction of the device and with decreasing processing temperature.

SUMMARY OF THE INVENTION

An object of the present invention is to provide a semiconductor device having contact to a supporting substrate of low resistivity which is applicable to FC mounting, and a method of manufacturing such semiconductor device. To achieve this object, a structure capable of fixing the rear surface potential of a semiconductor chip from its front surface side needs to be previously formed to cope with FC mounting.

The subject matter of the present invention is directed to a semiconductor device including a semiconductor supporting substrate, an insulation film layer formed on the semiconductor supporting substrate and a transistor formed on a semiconductor layer formed on the insulation film layer. An isolation oxide film is formed in the semiconductor layer. An interlayer insulation film is formed on the semiconductor layer and the isolation oxide film. A wiring layer is formed on the interlayer insulation film. A conductive layer connects the semiconductor supporting substrate and the wiring layer to thereby fix a potential of the semiconductor supporting substrate. The conductive layer and the wiring layer are formed around the periphery of a region in which the transistor is to be formed.

This allows the potential of a supporting substrate having SOI structure to be stably fixed to the ground potential with reliability even when the supporting substrate is positioned on the front surface side after mounting a bear semiconductor chip such as in mounting by the FC technique.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
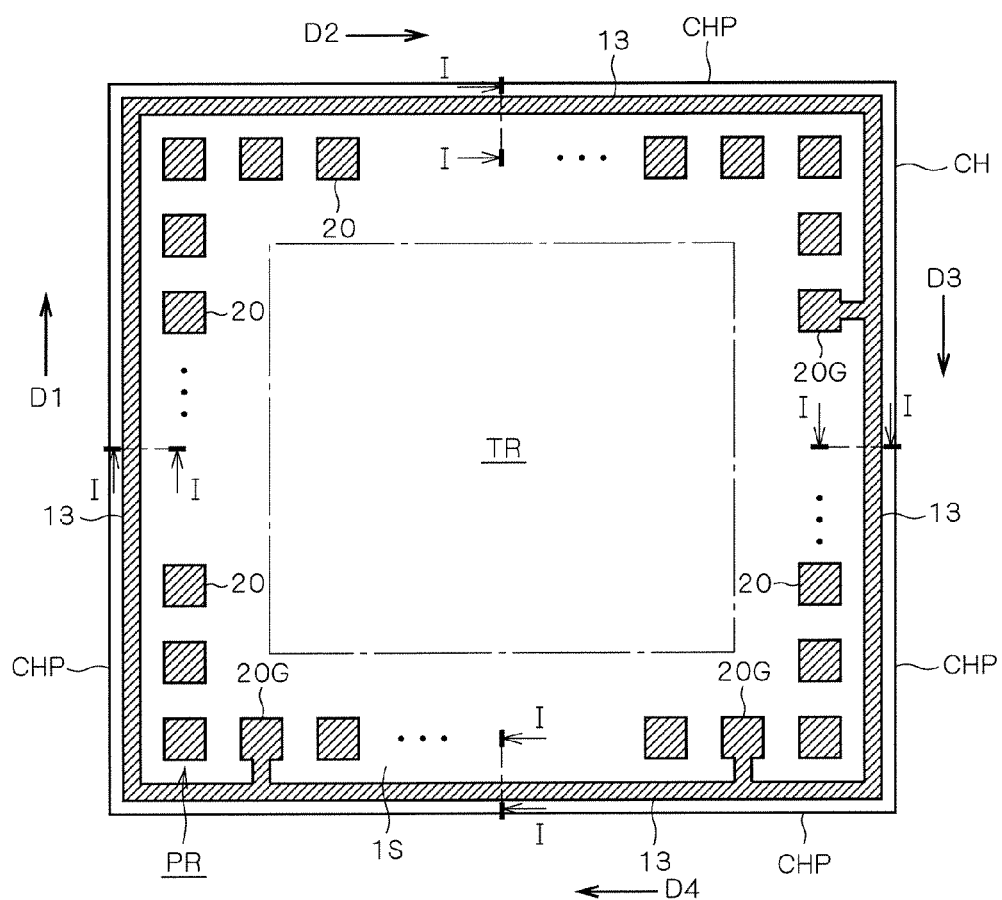
FIG. 1 is a plan view of a semiconductor chip common to first to third preferred embodiments of the present invention.

FIG. 1 is a plan view schematically showing the upper surface of a semiconductor chip CH contained in a semiconductor device according to the present embodiment. This drawing will also be referred to later in second and third preferred embodiments. The semiconductor chip CH is cut from a SOI wafer on which transistors, various components and the like have all been formed.

Figure 2:
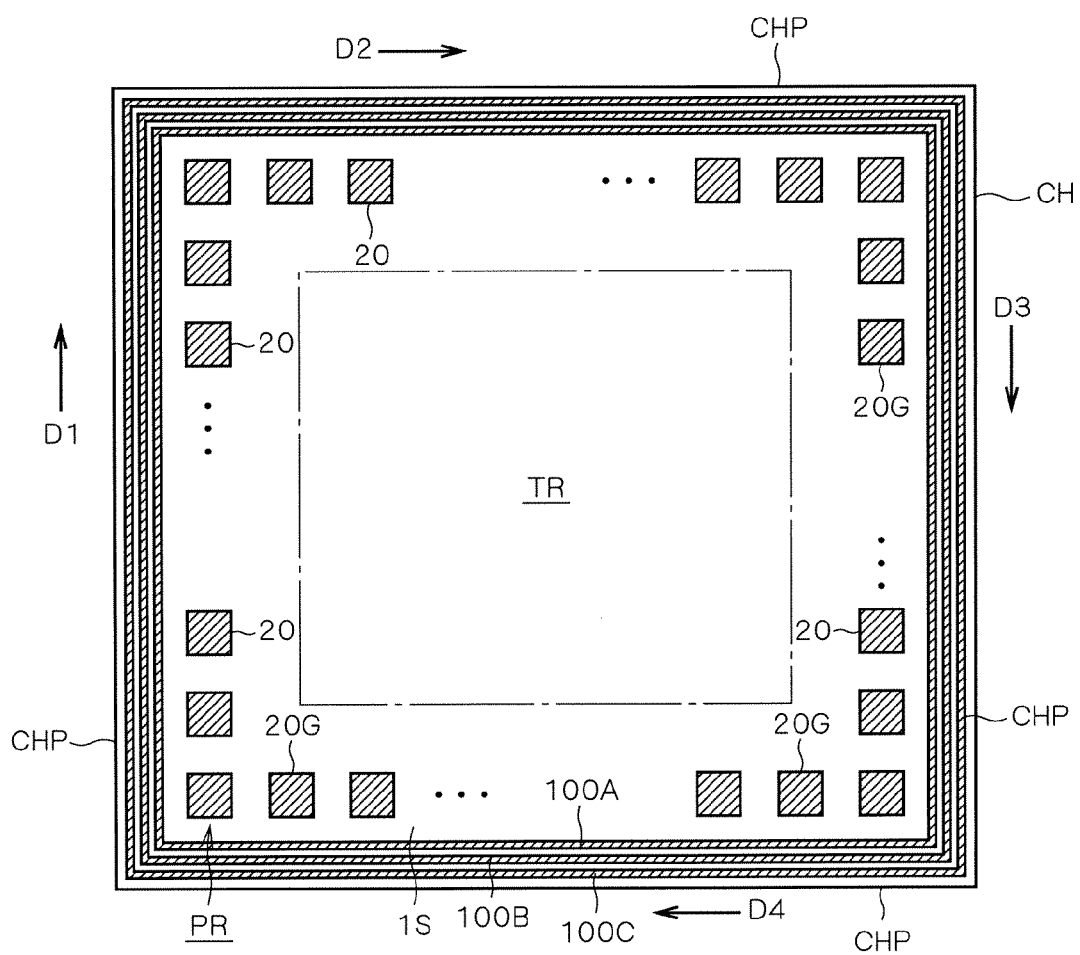
FIG. 2 is a plan view of the semiconductor chip common to the first to third preferred embodiments, schematically showing, in perspective, a guard ring part of the semiconductor chip.

As shown in FIG. 1, a transistor forming region TR including transistors such as MOSFETs formed on a SOI layer having SOI structure is present in the center of the semiconductor chip CH. Outside the periphery of the transistor forming region TR, a pad forming region PR including a plurality of pads 20 formed along a peripheral part CHP of the semiconductor chip CH on a surface 1S of the semiconductor chip CH is present so as to surround the entire periphery of the transistor forming region TR. Pads 20G of the plurality of pads 20 are ground pads to which a ground potential is to be applied. Further, an uppermost wire 13 made of metal wire such as aluminum is formed on part of the surface 1S of the semiconductor chip CH that is positioned outside the pad forming region PR so as to surround the entire peripheries of the transistor forming region TR and pad forming region PR. More specifically, the uppermost wire 13 is formed along the entire peripheral part CHP on part of the surface 1S of the semiconductor chip CH that is adjacent to the peripheral part CHP, and surrounds the entire transistor forming region TR in the semiconductor chip CH with a plurality of transistors formed thereon. This uppermost wire 13 is connected to the ground pads 20G. While not shown in FIG. 1, a plurality of guard rings connected to the uppermost wire 13 are formed directly under the uppermost wire 13 toward the upper surface of a supporting substrate (P-type silicon substrate or N-type silicon substrate) having SOI structure so as to surround the entire transistor forming region TR together with the uppermost wire 13. That is, holes extending between the upper surface of the supporting substrate having SOI structure and uppermost wire 13 are filled with wiring materials (conductive layers), whereby each of the plurality of guard rings electrically connects the upper surface of the supporting substrate and uppermost wire 13 with each other to fix the upper surface of the supporting substrate and uppermost wire 13 to the same potential. An exemplary structure of guard ring part forming the core of the device is shown in the plan view of FIG. 2. FIG. 2 is a plan view of the semiconductor chip CH, schematically showing, in perspective, three guard rings 100A, 100B and 100C positioned directly under and connected to the uppermost wire 13 (see FIG. 4 which will be referred to later). As shown in FIG. 2, the three guard rings 100A, 100B and 100C are formed along the entire peripheral part CHP of the semiconductor chip CH to surround the entire transistor forming region TR. The guard ring part may be formed of one guard ring.

Figure 3:
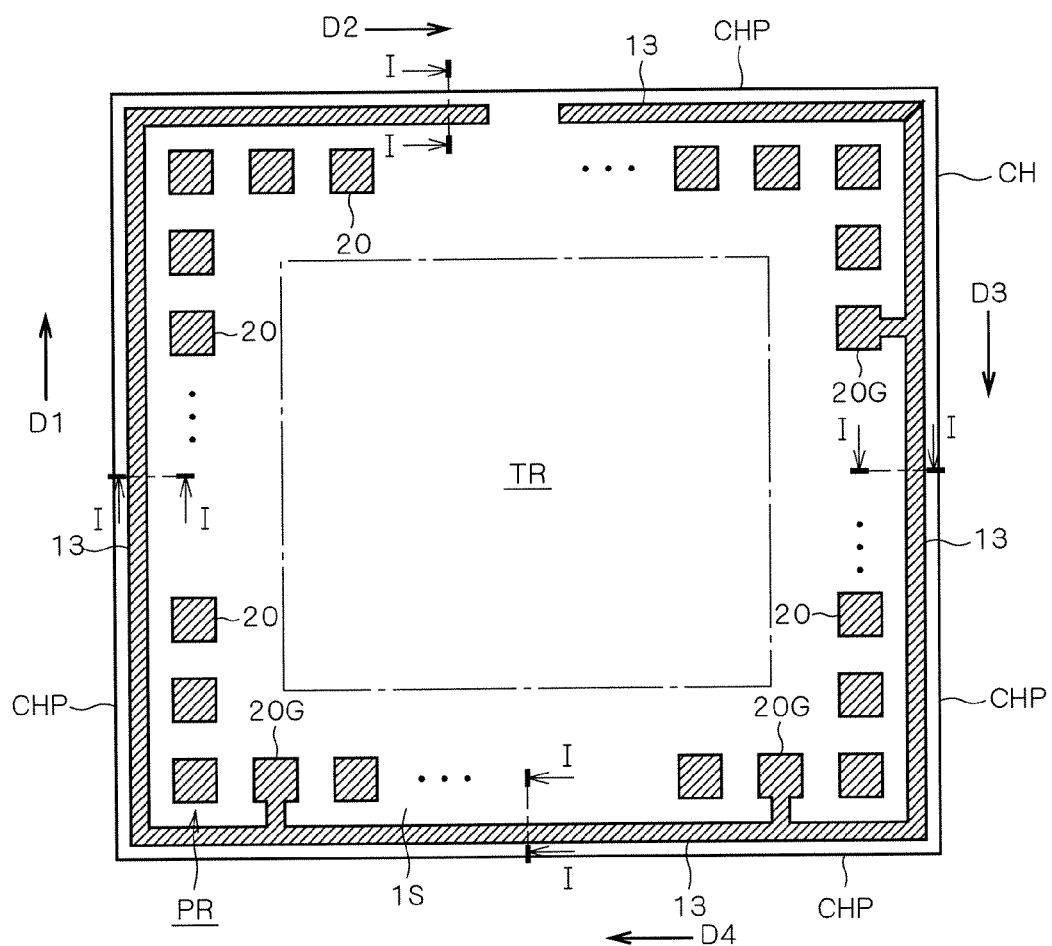
FIG. 3 is a plan view of a variation of the semiconductor chip common to the first to third preferred embodiments.

A variation of the chip shown in FIG. 1 is shown in FIG. 3 (which will also be referred to in the second and third preferred embodiments). In FIG. 3, the uppermost wire 13 and guard ring part (not shown) directly under the uppermost wire 13 formed along the peripheral part CHP are partly cut. Thus, the uppermost wire 13 and guard ring part directly under the uppermost wire 13 partly surround the transistor forming region TR. Considering the both cases shown in FIGS. 1 and 3, the uppermost wire 13 and guard ring part (conductive layer) directly under the uppermost wire 13 are expected to be provided around the transistor forming region TR.

Hereinafter, the structure of the guard ring part forming the core of the present embodiment will be described in detail with reference to a vertical sectional view shown in FIG. 4 taken along the line I-I of FIG. 1.

Figure 4:
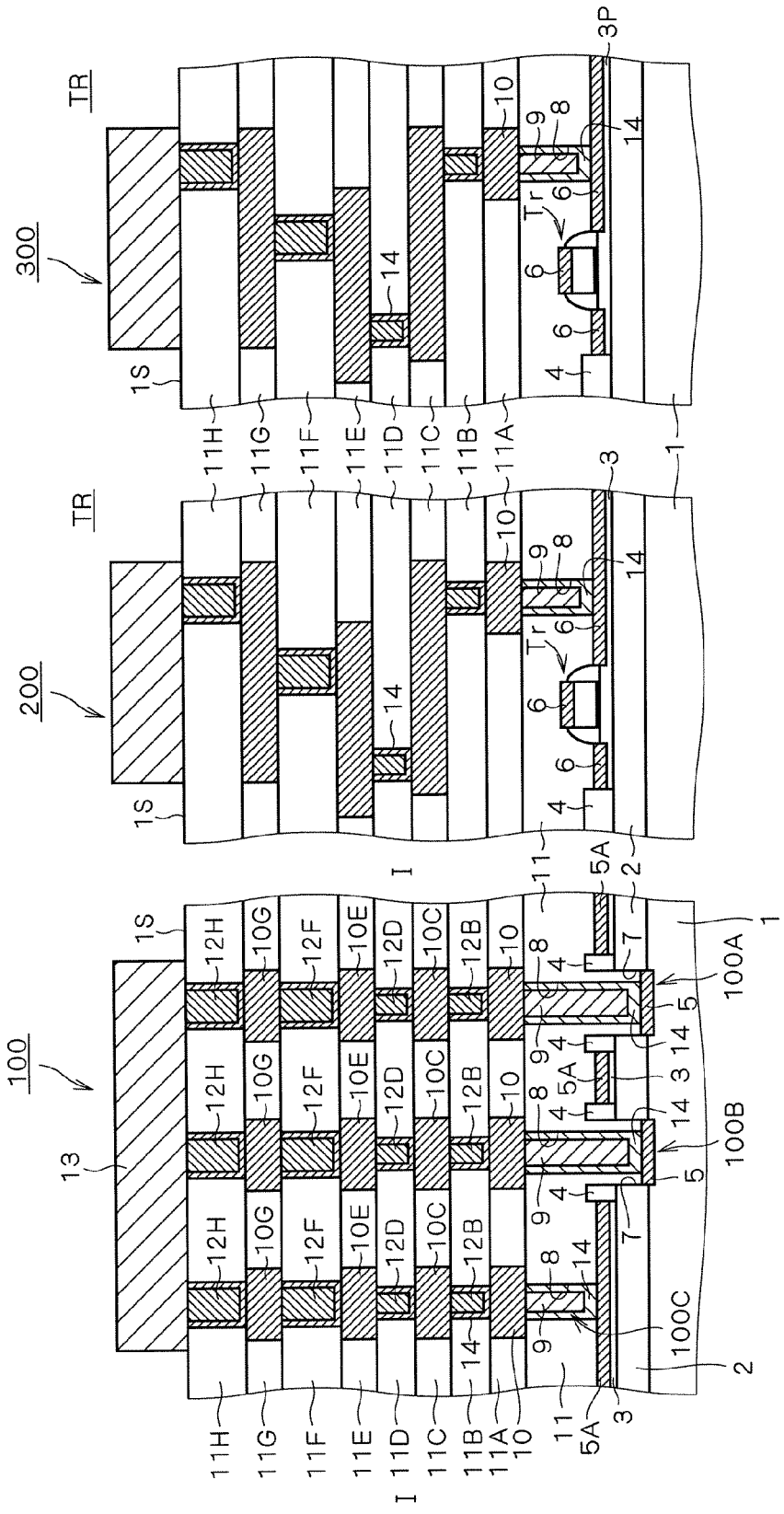
FIG. 4 is a vertical sectional view of an example of a semiconductor device according to the first preferred embodiment.

FIG. 4 is a vertical sectional view showing, for comparison purposes, a guard ring part 100 including the plurality of guard rings 100A, 100B and 100C, an NMOS part (where an N-type MOSFET is to be formed) 200 in the transistor forming region TR and a PMOS part (where a P-type MOSFET is to be formed) 300 in the transistor forming region TR. Here, a supporting substrate 1 having SOI structure is made of P-type silicon substrate, by way of example. Needless to say, an N-type silicon substrate may be employed instead of the P-type silicon substrate.

In FIG. 4, the three guard rings 100A, 100B and 100C connected to the uppermost wire 13 are provided side by side. Since the innermost first guard ring 100A and the next innermost second guard ring 100B have the same structure, the structure of the first guard ring 100A will be described. In summary, the structure of the first guard ring 100A is characterized by: forming a silicide layer (silicide part) 5 on the bottom of a first opening 7 formed by opening a BOX oxide film (insulation layer) 2 on the supporting substrate 1 and an isolation oxide film 4 thereon, i.e., in the exposed upper surface of the supporting substrate 1; and forming a contact connected to the silicide layer 5. The structure will be described below in more detail.

The first guard ring 100A includes the silicide layer 5 formed toward the inside of the supporting substrate 1 from its upper surface, and the first opening 7 having its bottom corresponding to the upper surface of the silicide layer 5 formed on the bottom of an opening formed to extend through the BOX oxide film 2 formed on the upper surface of the supporting substrate 1 and isolation oxide film 4 formed on the BOX oxide film 2. The first guard ring 100A further includes: a first interlayer insulation film 11 filling the first opening 7 and also formed above and around the first opening 7; a second opening or contact hole 8 extending through the first interlayer insulation film 11 in and above the first opening 7, having its bottom corresponding to part of the upper surface of the silicide layer 5, with the opening of the contact hole 8 corresponding to the upper surface of the first interlayer insulation film 11; and first wiring materials (9, 14) completely filling the contact hole 8. Here, a barrier metal 14 formed on the bottom and sidewall of the contact hole 8 and a plug 9 formed inside the barrier metal 14 are generically defined as "first wiring material" or "conductive layer". Further, a plurality of interlayer insulation films 11A, 11B, 11C, 11D, 11E, 11F, 11G and 11H are stacked between the opening of the contact hole 8 and the first interlayer insulation film 11 around the opening, and the uppermost wire 13. The first guard ring 100A includes a plurality of wires 10, 10C, 10E and 10G respectively provided in the corresponding interlayer insulation films 11A, 11C, 11E and 11G of these plurality of interlayer insulation films 11A to 11H, and further includes second wiring materials (conductive layers) 12B, 12D and 12F respectively provided in the interlayer insulation films 11B, 11D and 11F and connecting adjacent ones of the wires 10, 10C, 10E and 10G that overlap each other. In addition, the first guard ring 100A includes a third wiring material (conductive layer) 12H provided in the uppermost interlayer insulation film 11H and connecting the wire 10G which is the uppermost one of the wires 10, 10C, 10E and 10G and the uppermost wire 13. A matter of importance is that the components of the first guard ring 100A, i.e., silicide layer 5, first opening 7, isolation oxide film 4, contact hole 8, first wiring materials (9, 14), plurality of wires 10, 10C, 10E and 10G, second wiring materials 12B, 12D and 12F and third wiring material 12H all extend along the entire peripheral part CHP of the semiconductor chip CH together with the uppermost wire 13 (in first direction D1, second direction D2 perpendicular to first direction D1, third direction D3 perpendicular to second direction D2 and fourth direction D4 perpendicular to third direction D3), to thereby surround the entire transistor forming region TR (while this case illustrates wiring installed in five layers, the number of layers of wiring is not limited to five in the present embodiment).

The first opening 7 preferably has a width smaller than twice the thickness of the first interlayer insulation film 11 which fills the first opening 7. This is because the first interlayer insulation film 11 will not be able to completely fill the first opening 7, unless set at such size, causing a space in the first opening 7.

The outermost third guard ring 100C differs from the first guard ring 100A in that the bottom of the contact hole 8 included in the third guard ring 100C corresponds to the upper surface of a silicide layer 5A formed on the SOI layer 3, so that the third guard ring 100C is incapable of fixing the potential of the supporting substrate 1.

On the other hand, in the NMOS part 200, a transistor Tr has silicide regions 6 formed in the gate of the transistor Tr and in source/drain regions in an active region, a gate insulation film, a sidewall spacer, a contact hole 8 filled with conductive layers including plug 9, etc., and a wire 10, and above the transistor Tr, the plurality of interlayer insulation films 11A, 11B, 11C, 11D, 11E, 11F, 11G and 11H are stacked to reach the surface 1S of the semiconductor chip CH. In the NMOS part 200, the conductive layers and wires are also formed alternately in the respective interlayer insulation films (a wire for the NMOS part 200 is also installed on the surface 1S). Further, the PMOS part 300 basically has the same structure as the NMOS part 200 except that the PMOS part 300 includes a SOI layer 3P of N-type conductivity, as shown in FIG. 4.

The use of the semiconductor chip CH including the guard ring part 100 according to the present embodiment described above (1) allows the potential of the supporting substrate 1 having SOI structure to be always fixed stably to the ground potential, even when the supporting substrate 1 is positioned on the front surface side by mounting the semiconductor chip CH by the FC technique, and (2) implements a contact to the supporting substrate of low resistivity by electric conduction between the silicide layer 5 formed on the upper surface of the supporting substrate 1 and uppermost wire 13. Further, the plurality of guard rings 100A and 100B allow the supporting substrate to be fixed in stable contact resistivity. In addition, the inventors of the present application have verified that providing the plurality of guard rings 100A, 100B and 100C in this structure produces an advantage of overcoming the problem that the use of the plurality of low-dielectric constant interlayer insulation films 11A to 11H causes the wires 10, 10C, 10E and 10G made of copper and the like to become brittle when dicing the interlayer insulation films. It is of significance to provide a plurality of guard rings in this respect as well.

The third guard ring 100C may be changed to a similar structure as that of the first and second guard rings 100A and 100B.

First Variation

Figure 5:
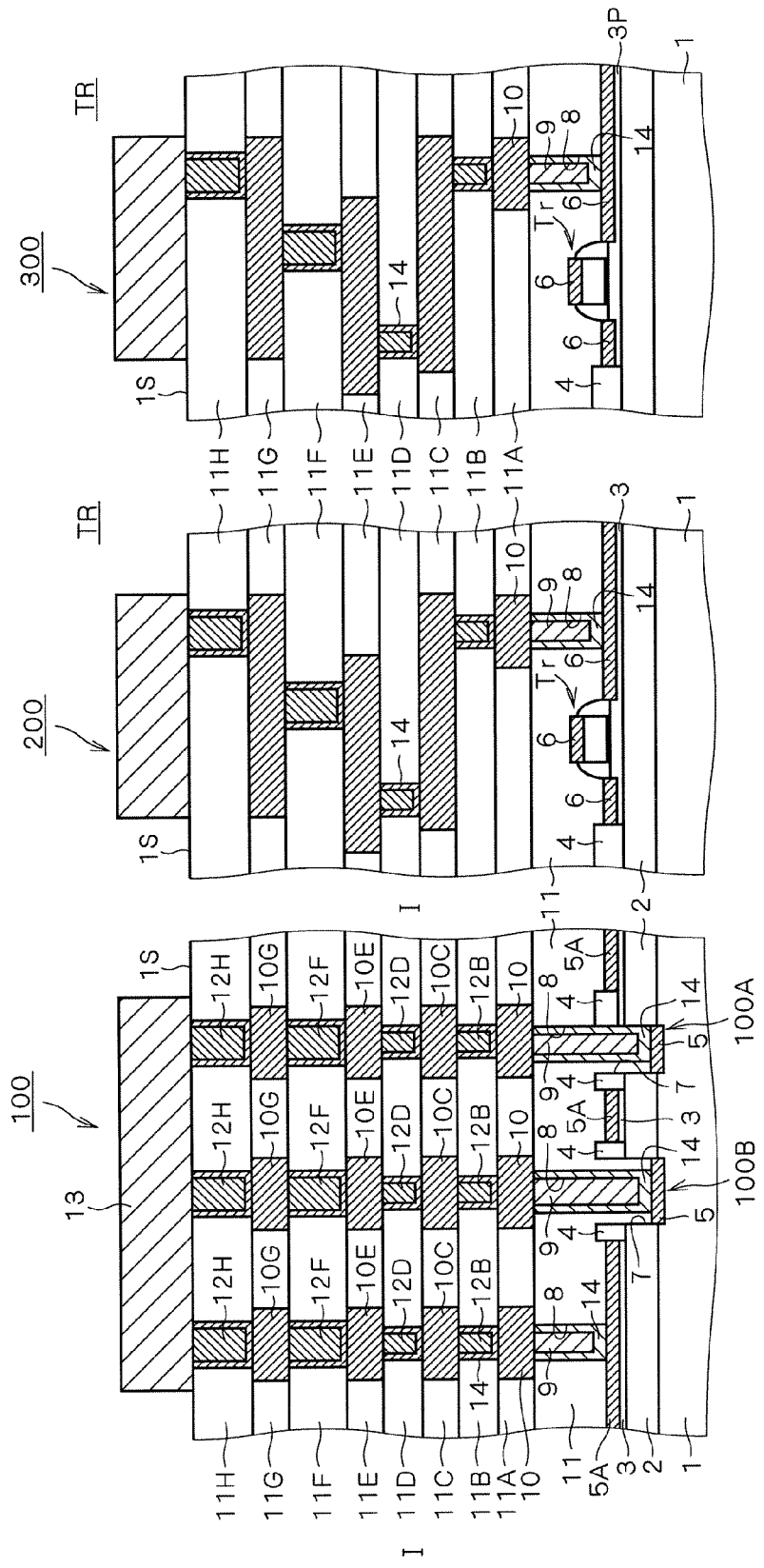
FIG. 5 is a vertical sectional view of a semiconductor device according to a variation of the first preferred embodiment.

As shown in the sectional view of FIG. 5, part of the contact hole 8 in the first guard ring 100A may be made in contact with the SOI layer 3 forming a well in the transistor forming region TR.

This variation allows the well in the transistor forming region TR to be fixed in potential by the contact to the supporting substrate at the same time as the supporting substrate.

Second Preferred Embodiment

Figure 6:
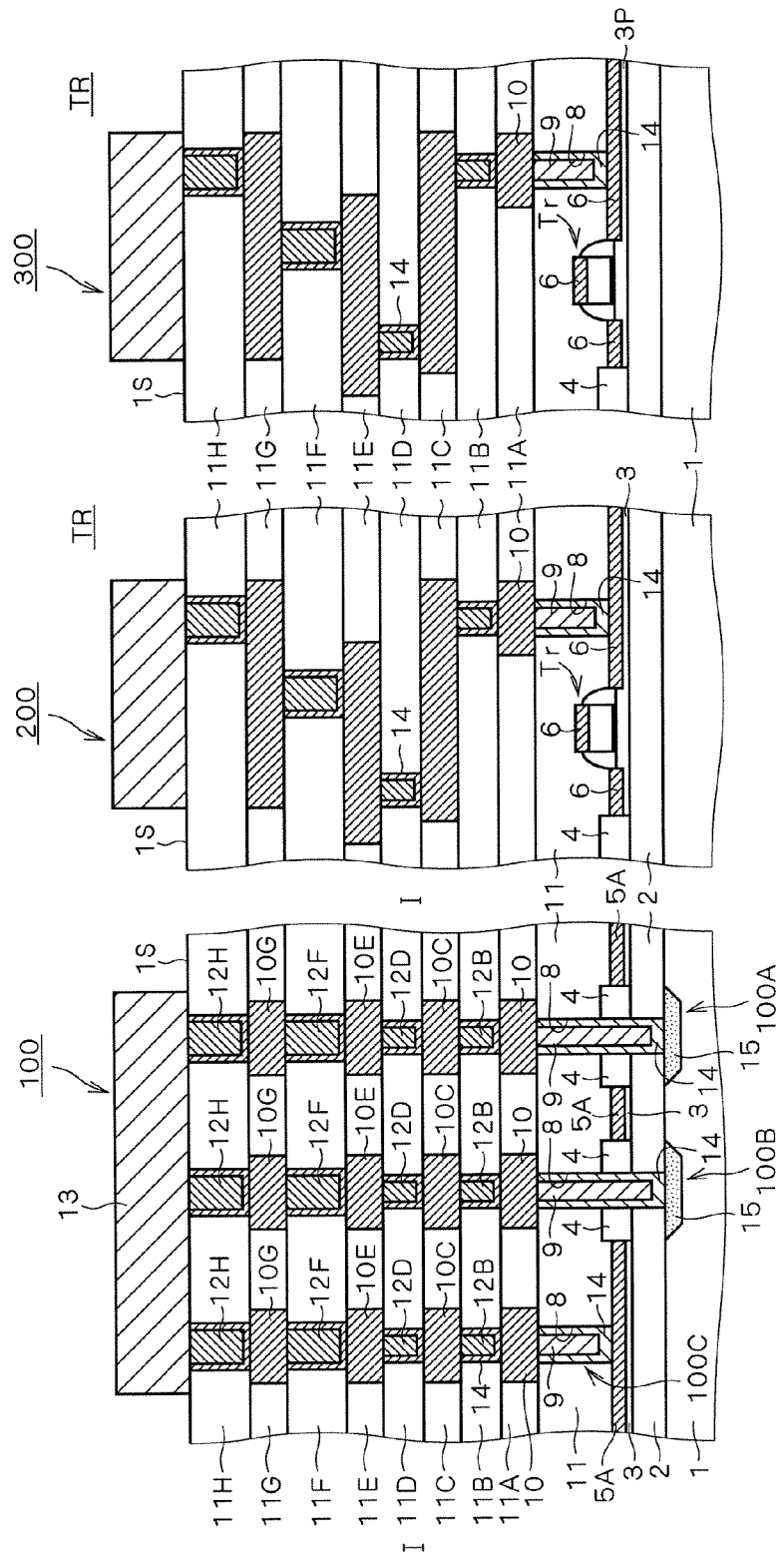
FIG. 6 is a vertical sectional view of an example of a semiconductor device according to a second preferred embodiment.

FIG. 6 is a vertical sectional view of a semiconductor device according to the present embodiment, taken along the line I-I of FIG. 1, that corresponds to FIG. 4 mentioned above.

The difference in structure of the first guard ring 100A shown in FIG. 6 from the first guard ring 100A shown in FIG. 4 will be described below.

The first guard ring 100A according to the present embodiment includes, instead of the silicide layer 5 shown in FIG. 4, a semiconductor layer 15 having a high impurity concentration (since a P-type silicon substrate is employed as the supporting substrate 1 by way of example, the semiconductor layer 15 is a $P^+$ layer) formed toward the inside of the supporting substrate 1 from its upper surface, containing impurities of the same conductivity type as the supporting substrate 1 and having an impurity concentration higher than that of the supporting substrate 1, and further includes a contact hole 8 extending through the BOX oxide film 2 on the semiconductor layer 15, isolation oxide film 4 formed on the BOX oxide film 2 and first interlayer insulation film 11 formed on the isolation oxide film 4, having its bottom corresponding to part of the upper surface of the semiconductor layer 15, with the opening of the contact hole 8 corresponding to the upper surface of the first interlayer insulation film 11. The other components are similar to corresponding components in the first preferred embodiment.

A matter of importance is that the semiconductor layer 15, isolation oxide film 4, contact hole 8, first wiring materials (9, 14), plurality of wires 10, 10C, 10E and 10G, second wiring materials 12B, 12D and 12F and third wiring material 12H all extend along the entire peripheral part CHP of the semiconductor chip CH together with the uppermost wire 13, to thereby surround the entire transistor forming region TR.

It is needless to say that the semiconductor device having the structure of the present embodiment produces advantages similar to those of the first preferred embodiment.

Second Variation

Figure 7:
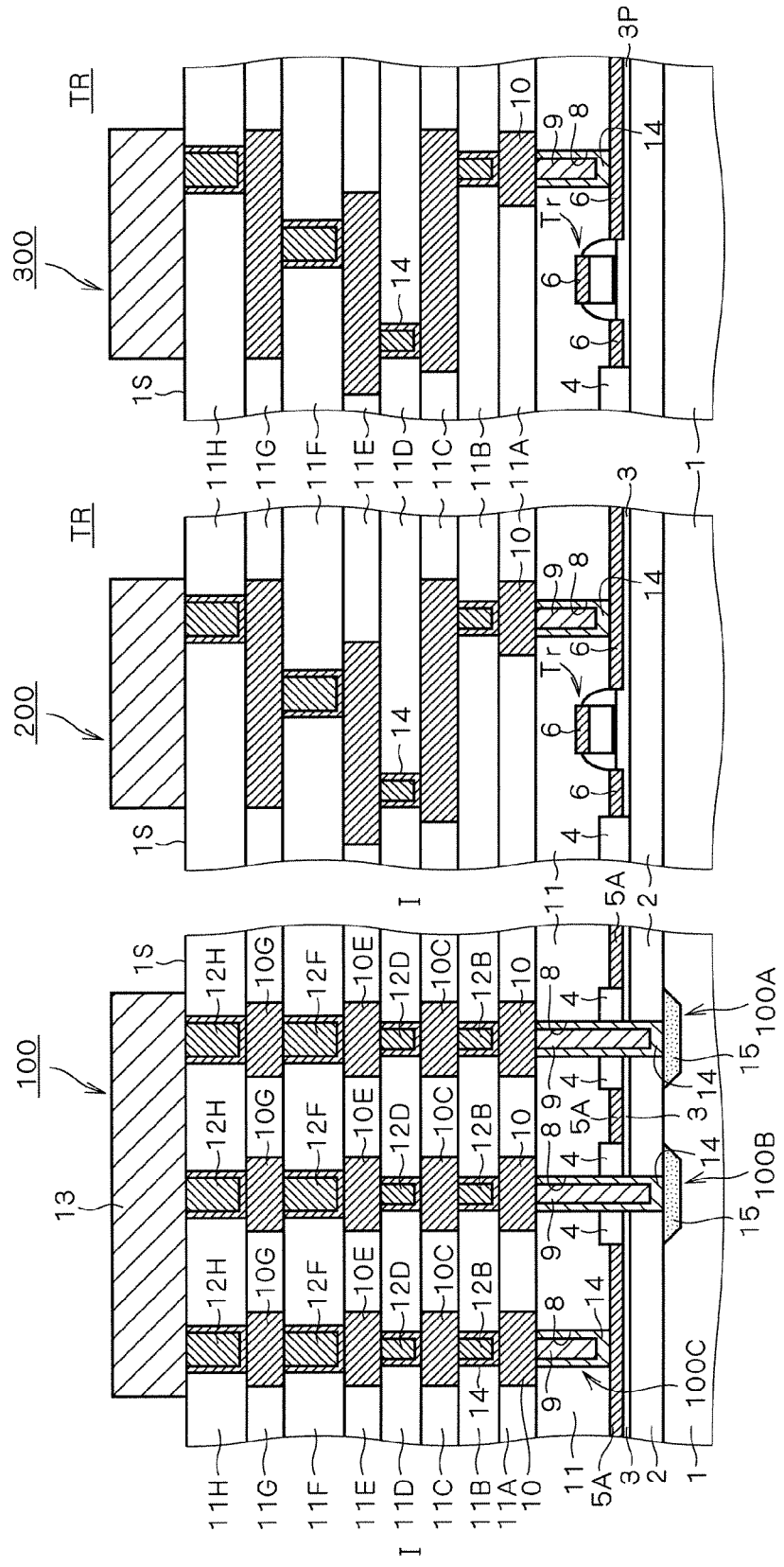
FIG. 7 is a vertical sectional view of a semiconductor device according to a variation of the second preferred embodiment.

As shown in the sectional view of FIG. 7, part of the contact holes 8 in the first and second guard rings 100A and 100B may be made in contact with the SOI layer 3 forming the well in the transistor forming region TR.

This variation allows the well in the transistor forming region TR to be fixed in potential by the contact to the supporting substrate at the same time as the supporting substrate.

Third Preferred Embodiment

Figure 8:
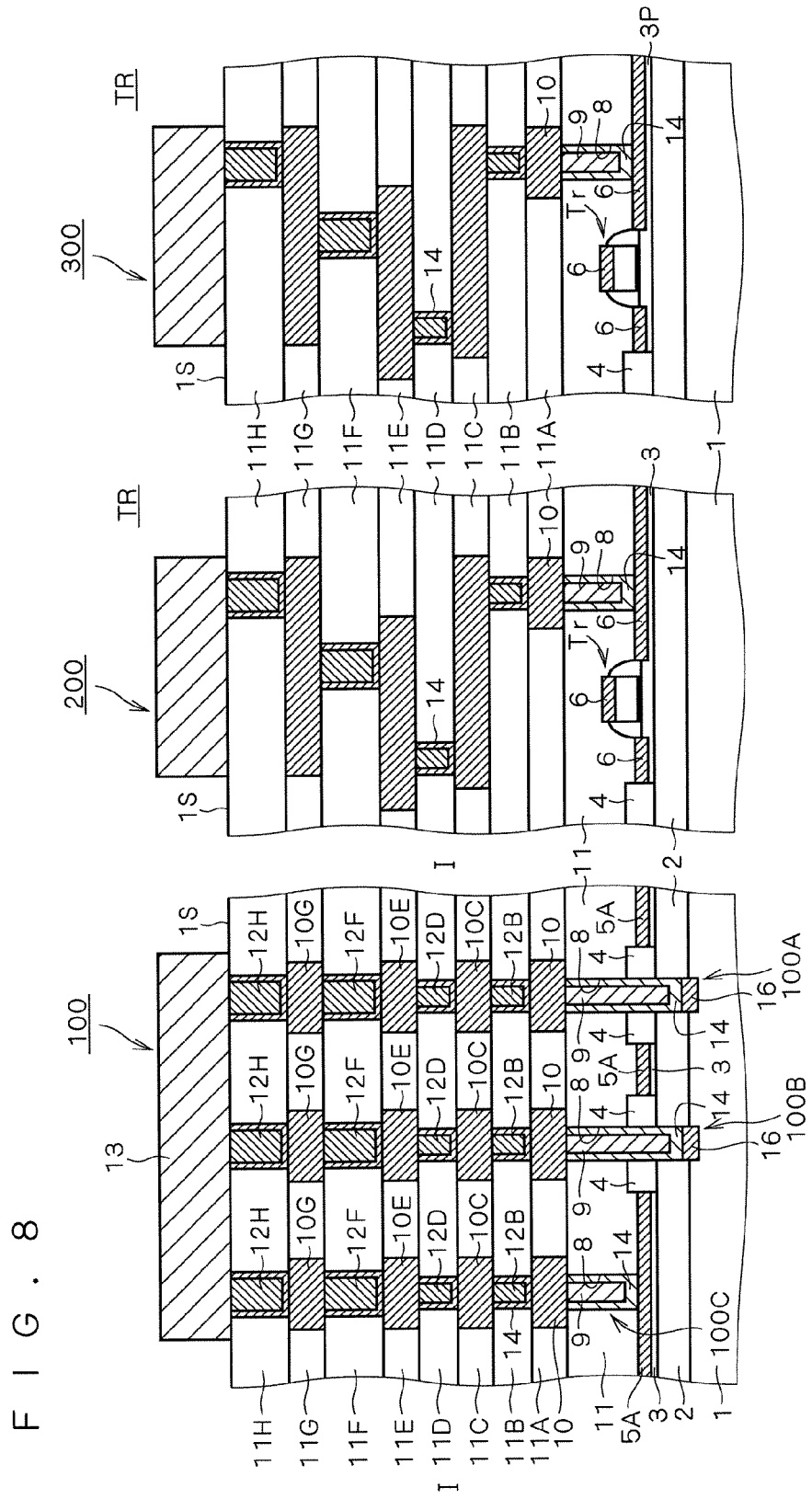
FIG. 8 is a vertical sectional view of an example of a semiconductor device according to a third preferred embodiment.

FIG. 8 is a vertical sectional view of a semiconductor device according to the present embodiment, taken along the line I-I of FIG. 1, that corresponds to FIG. 4 mentioned above.

The difference in structure of the first guard ring 100A shown in FIG. 8 from the first guard ring 100A shown in FIG. 4 will be described below.

The first guard ring 100A according to the present embodiment includes a silicide layer 16 formed on the upper surface of the supporting substrate 1, and further includes a contact hole 8 extending through the BOX oxide film 2 on the silicide layer 16, isolation oxide film 4 formed on the BOX oxide film 2 and first interlayer insulation film 11 formed on the isolation oxide film 4, having its bottom corresponding to the upper surface of the silicide layer 16, with the opening of the contact hole 8 corresponding to the upper surface of the first interlayer insulation film 11. In other words, the silicide layer 16 forms the bottom of the contact hole 8 for the supporting substrate 1. The other components are similar to corresponding components in the first preferred embodiment.

A matter of importance is that the silicide layer 16, isolation oxide film 4, contact hole 8, first wiring materials (9, 14), plurality of wires 10, 10C, 10E and 10G, second wiring materials 12B, 12D and 12F and third wiring material 12H all extend along the entire peripheral part CHP of the semiconductor chip CH together with the uppermost wire 13, to thereby surround the entire transistor forming region TR.

The semiconductor device having the structure of the present embodiment produces advantages similar to those of the first preferred embodiment.

Third Variation

Figure 9:
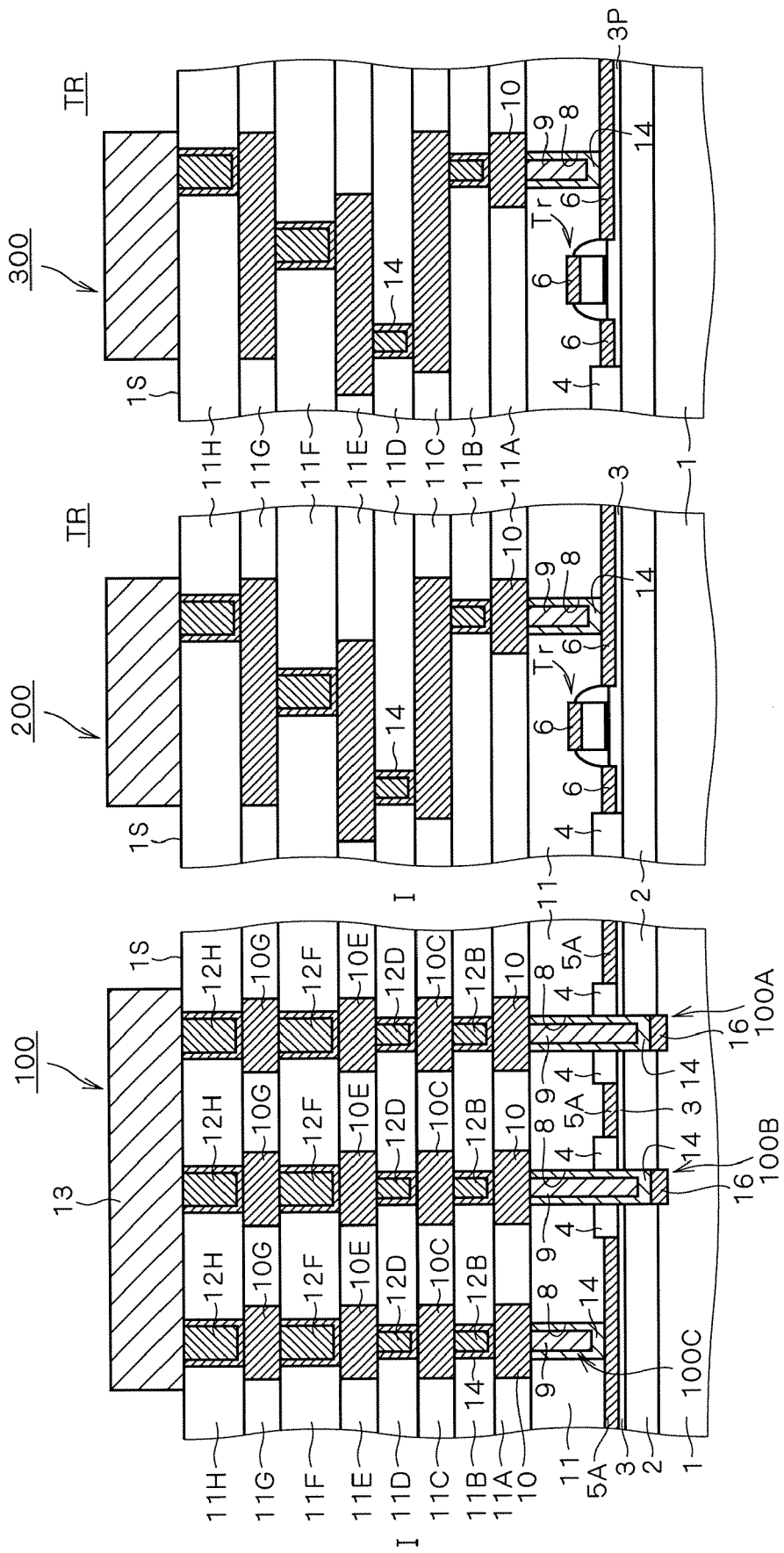
FIG. 9 is a vertical sectional view of a semiconductor device according to a variation of the third preferred embodiment.
Figure 10:
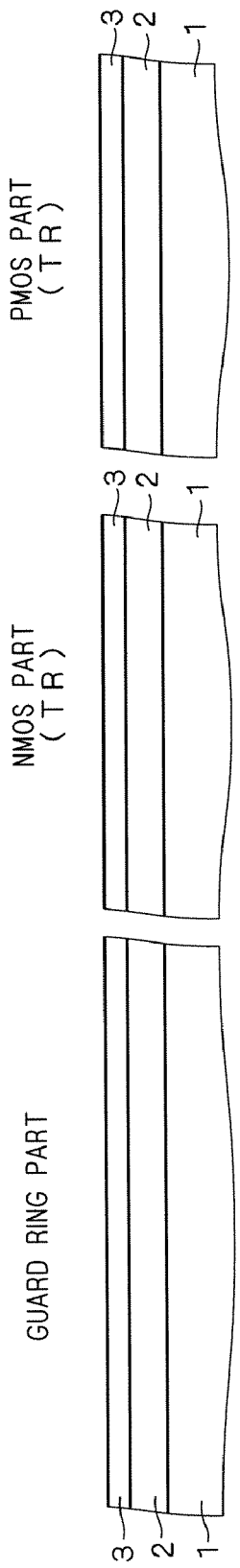
FIGS. 10A-10C, 11A-11C, 12A-12C, 13A-13C, 14A-14C, 15A-15C, 16A-16C, 17A-17C, 18A-18C and 19A-19C are vertical sectional views showing manufacturing steps of a semiconductor device according to a fourth preferred embodiment.
Figure 11:
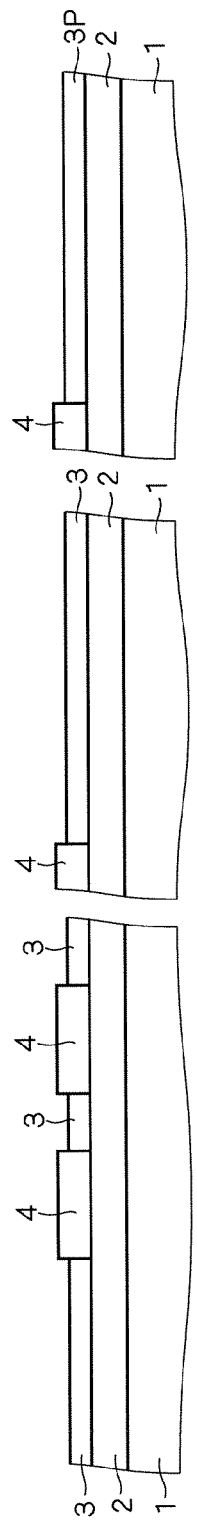
Figure 12:
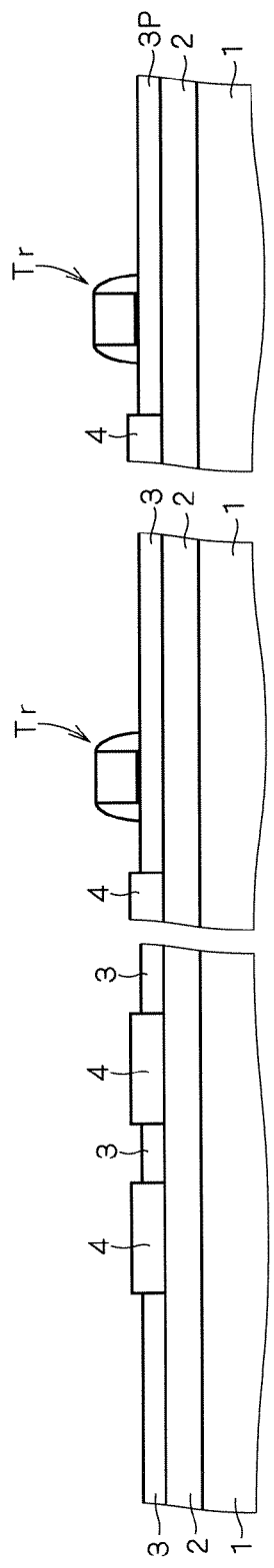
Figure 13:
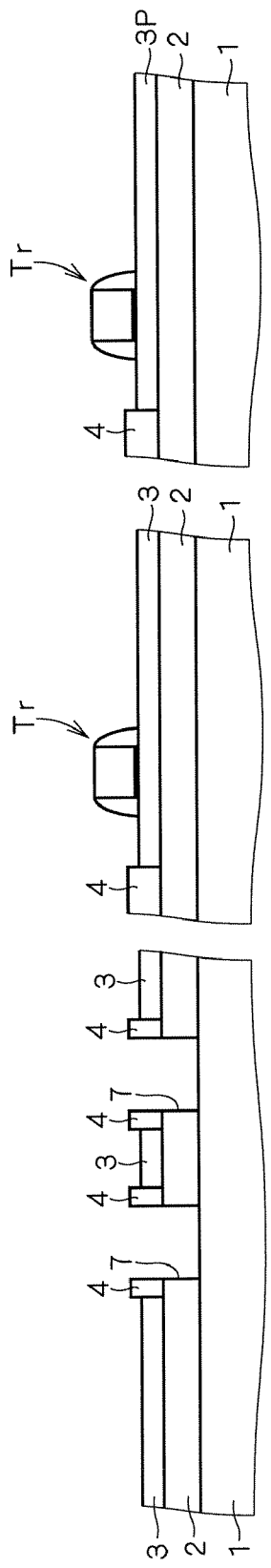
Figure 14:
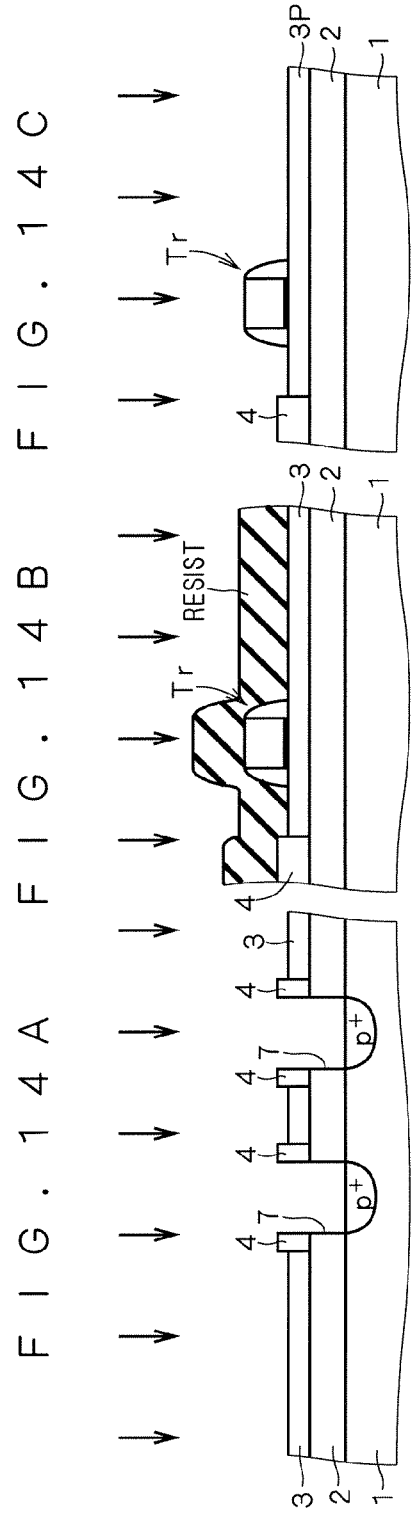
Figure 15:
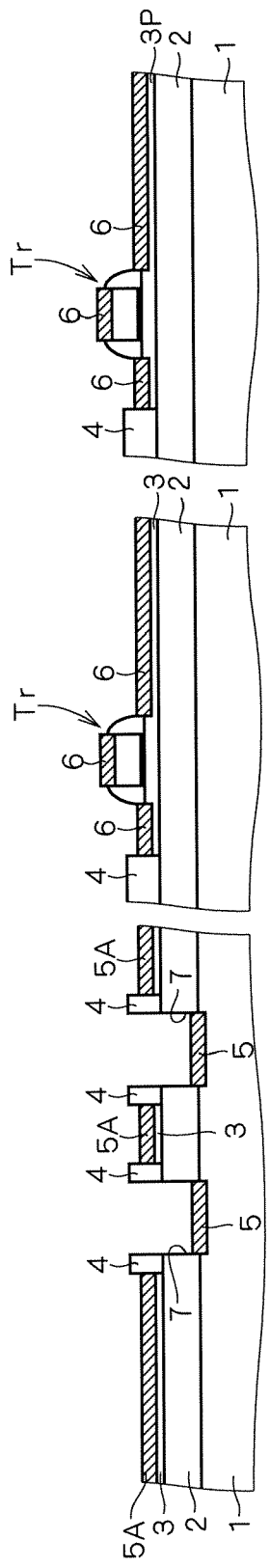
Figure 16:
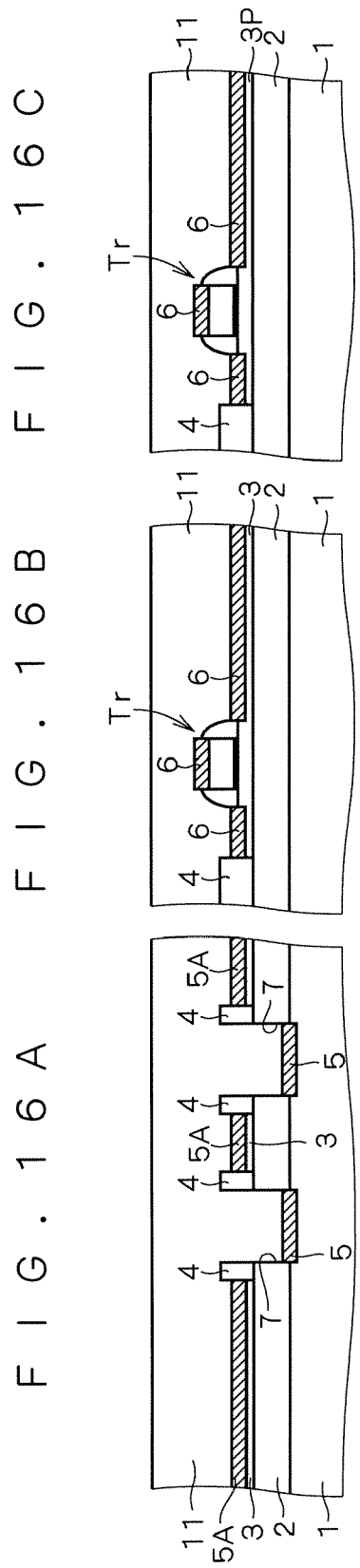
Figure 17:
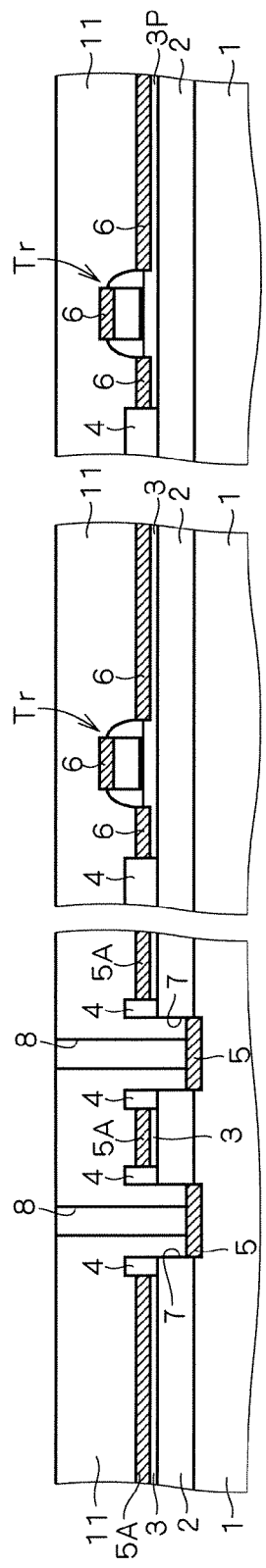
Figure 18:
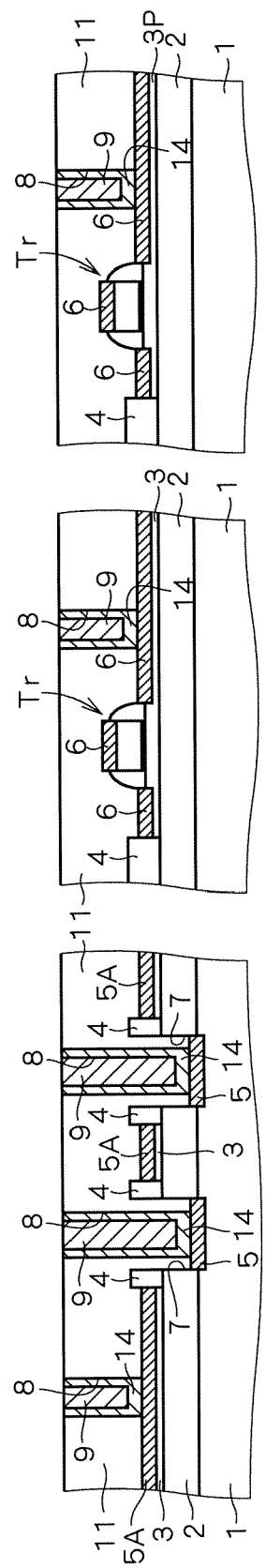
Figure 19:
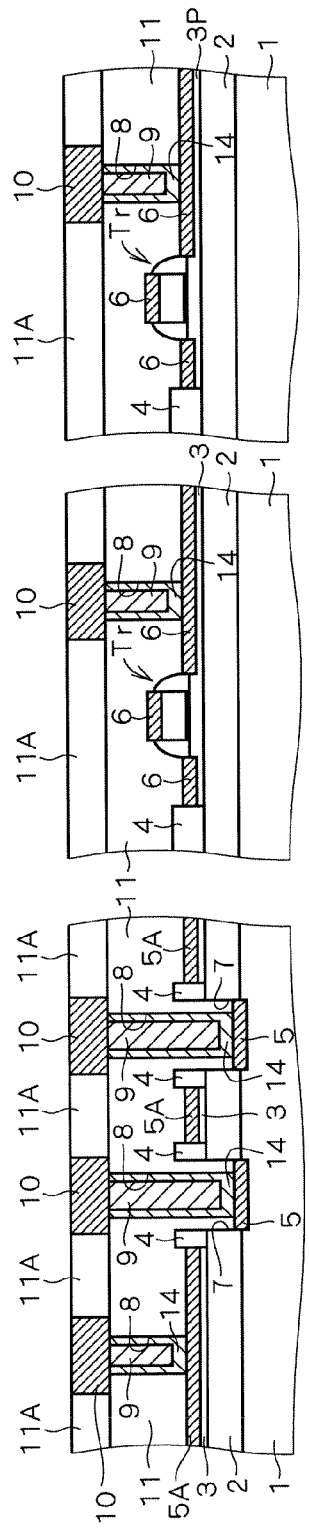

As shown in the sectional view of FIG. 9, part of the contact holes 8 in the first and second guard rings 100A and 100B may be made in contact with the SOI layer 3 forming the well in the transistor forming region TR.

This variation allows the well in the transistor forming region TR to be fixed in potential by the contact to the supporting substrate at the same time as the supporting substrate.

Fourth Preferred Embodiment

The present embodiment relates to a method of manufacturing the semiconductor device according to the first preferred embodiment, and more particularly to a method of manufacturing the guard ring part described in the first preferred embodiment. Hereinafter, respective steps will be described with reference to vertical sectional views shown in FIGS. 10A-19A, FIGS. 10B-19B, FIGS. 10C-19C and FIG. 4 mentioned above. Of these steps, FIGS. 10A-19A are vertical sectional views showing manufacturing steps of the first to third guard rings 100A, 100B and 100C described in the first preferred embodiment referring to FIG. 4, FIGS. 10B-19B are vertical sectional views showing manufacturing steps of the NMOS part in the transistor forming region TR (FIG. 1) positioned in the center of a SOI wafer, and FIGS. 10C-19C are vertical sectional views showing manufacturing steps of the PMOS part in the transistor forming region TR (FIG. 1). Since the transistor forming region TR is not the core of the present invention, description of manufacturing steps of the PMOS part will be omitted below. Reference character 3P in each step drawing of the PMOS part indicates an N-type semiconductor layer formed in the SOI layer 3.

In FIGS. 10A and 10B, a SOI wafer is prepared. The SOI wafer may be produced or purchased in the market. At this time, the SOI wafer is formed of the supporting substrate 1 (e.g., P-type silicon substrate), BOX oxide film 2 formed thereon and SOI layer 3 (P-type semiconductor layer in this embodiment) formed thereon.

In the next step shown in FIGS. 11A and 11B, a plurality of isolation oxide films 4 isolating the SOI layer 3 into a plurality of portions are formed on the BOX oxide film 2.

In the next step shown in FIGS. 12A and 12B, the MOS structure for the transistor Tr is formed on the SOI layer 3 in the NMOS part. The transistor Tr has a gate insulation film, a gate electrode and a sidewall spacer.

In the next step shown in FIGS. 13A and 13B, in the guard ring part, the isolation oxide films 4 and BOX oxide film 2 are opened to form a plurality of first openings 7 connected to the supporting substrate 1. Each of the first openings 7 extends through a corresponding one of the isolation oxide films 4 and BOX oxide film 2 directly thereunder to reach the surface of the supporting substrate 1. As previously mentioned in the first preferred embodiment, each of the first openings 7 preferably has a width smaller than twice the thickness of the first interlayer insulation film which will be described later.

In the next step shown in FIGS. 14A and 14B, ions of predetermined conductivity type are implanted into the NMOS part and guard ring part to form source/drain regions. The step of ion implantation (of P-type ions in this embodiment) shown in FIG. 14A for forming source/drain (S/D) is an optional step, and may be omitted. Since source/drain regions are also formed by implanting ions of predetermined conductivity type into the PMOS part in the step shown in FIG. 14C, a $P^+$ layer is in result formed from the surface of the supporting substrate 1 toward the inside thereof, as shown in FIG. 14A.

In the next step shown in FIGS. 15A and 15B, in order to form a silicide layer, a predetermined metal is stacked on the NMOS part and guard ring part, and thermal processing is carried out.

As a result, as shown in FIGS. 15A and 15B, in the NMOS part, silicide regions 6 are formed on the gate electrode and in the source/drain regions (the active region) of the transistor Tr (which also applies to the PMOS part shown in FIG. 15C). At this time, the silicide layer 5 is also formed on the bottom of the first openings 7, i.e., the exposed surface of the supporting substrate 1 in the guard ring part, concurrently with the silicide regions 6. At the same time, a silicide layer 5A is formed on the exposed surface of the SOI layer 3 in the guard ring part.

In the next step shown in FIGS. 16A and 16B, the first interlayer insulation film 11 which completely fills the first openings 7 and covers the transistor Tr is formed in the NMOS part and guard ring part.

In the next step shown in FIGS. 17A and 17B, the first interlayer insulation film 11 is etched using a predetermined mask to form second openings or contact holes 8 extending through the first interlayer insulation film 11 to reach the silicide layer 5, in the guard ring part. In opening the contact holes 8, a typical contact opening mask for opening on the SOI layer 3 may also be used, or another mask dedicated to forming the contact holes 8 may be used. The present embodiment employs the latter case.

In the next step shown in FIGS. 18A and 18B, first, a contact hole 8 reaching the silicide region 6 in the NMOS part and a contact hole 8 reaching the silicide layer 5A in the guard ring part are formed. Then, the barrier metal 14 is formed on the bottom and sidewall of each of the contact holes 8, and the contact holes 8 are completely filled with a wiring material (conductive layer) such as plug 9.

In the next step shown in FIGS. 19A and 19B, the lowermost interlayer insulation film 11A is formed, and the lowermost wire 10 (made of e.g., copper) connected to the surface of the plug 9 present in the opening of each of the contact holes 8 in the guard ring part and NMOS part is formed in the lowermost interlayer insulation film 11A. The following steps will be described referring again to FIG. 4.

As shown in FIG. 4, the second interlayer insulation film 11B is formed on the lowermost interlayer insulation film 11A, openings (via holes) having their bottom corresponding to the upper surface of the wire 10 are formed in the interlayer insulation film 11B, and the wiring material (conductive layer) 12B is formed to completely fill the openings. Further, the third interlayer insulation film 11C is formed on the interlayer insulation film 11B, and the wire 10C (made of e.g., copper) connected to the wiring material 12B is formed in the interlayer insulation film 11C. The fourth interlayer insulation film 11D is formed on the interlayer insulation film 11C, and the wiring material (conductive layer) 12D is formed therein. Then, the fifth interlayer insulation film 11E is formed on the interlayer insulation film 11D, and the wire 10E (made of e.g., copper) is formed therein. The sixth interlayer insulation film 11F is formed on the interlayer insulation film 11E, and the wiring material (conductive layer) 12F is formed therein. The seventh interlayer insulation film 11G is formed on the interlayer insulation film 11F, and the uppermost wire 10G (made of e.g., copper) is formed therein. The eighth interlayer insulation film 11H is formed on the interlayer insulation film 11G, and the uppermost wiring material (conductive layer) 12H connected to the uppermost wire 10G is formed therein. Then, the uppermost wire 13 (made of, e.g., aluminum) connected to the uppermost wiring material 12H is formed on the eighth interlayer insulation film 11H. The potential of the supporting substrate 1 is fixed by the structure of these wires and conductive layers in the interlayer insulation films 11A-11H.

A matter of importance is that the plurality of silicide layers 5, plurality of isolation oxide films 4, plurality of first openings 7, plurality of contact holes 8, plurality of first wiring materials 9, plurality of wires 10, 10C, 10E and 10G, plurality of second wiring materials 12B, 12D, 12F and 12H and uppermost wire 13 all extend in the first to fourth directions D1 to D4 (see FIG. 1), to thereby surround the entire transistor forming region TR.

Cutting the SOI wafer having such structure into chips, the semiconductor chip CH having the upper surface illustrated in FIG. 1 is obtained.

Fifth Preferred Embodiment

The present embodiment relates to a method of manufacturing the semiconductor device according to the second preferred embodiment, and more particularly to a method of manufacturing the guard ring part described in the second preferred embodiment. Hereinafter, the method of manufacturing the guard ring part will be described in terms of steps different from those of the fourth preferred embodiment, while steps of manufacturing the NMOS part and PMOS part in the transistor forming region will be omitted. FIGS. 10A, 11A and 12A will thus be mentioned.

Figure 20:
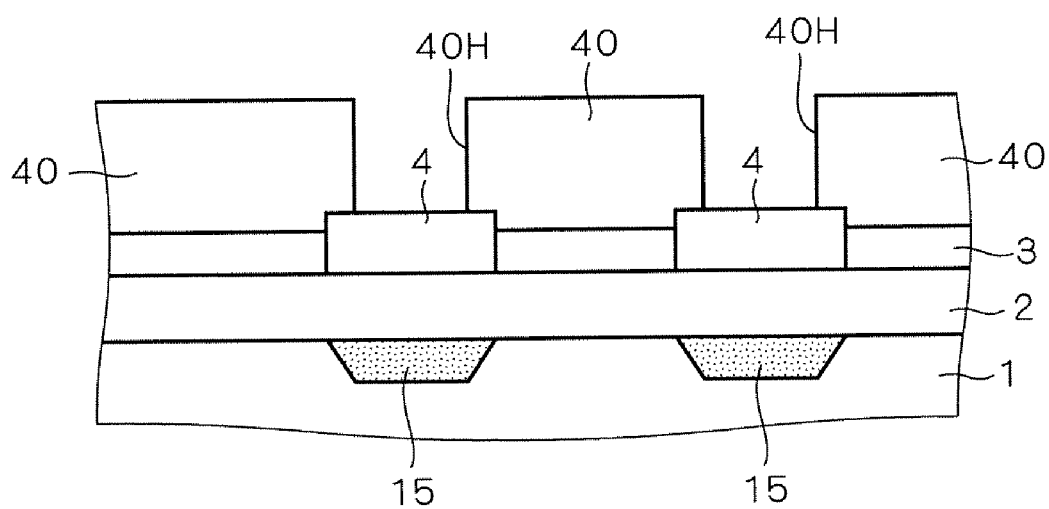
FIGS. 20-22 are vertical sectional views showing manufacturing steps of a semiconductor device according to a fifth preferred embodiment.

In FIG. 20, a resist pattern 40 having openings 40H for the respective isolation oxide films 4 in the guard ring part is formed on the SOI layer 3. Then, ion implantation is carried out using the resist pattern 40 as a mask to form the highly-doped semiconductor layers 15 (highly-doped $P^+$ semiconductor layers in this embodiment) in the upper surface of the supporting substrate 1 directly under the respective openings 40H. The highly-doped semiconductor layers 15 contain impurities of the same conductivity type as the supporting substrate 1 and have an impurity concentration higher than that of the supporting substrate 1.

Figure 21:
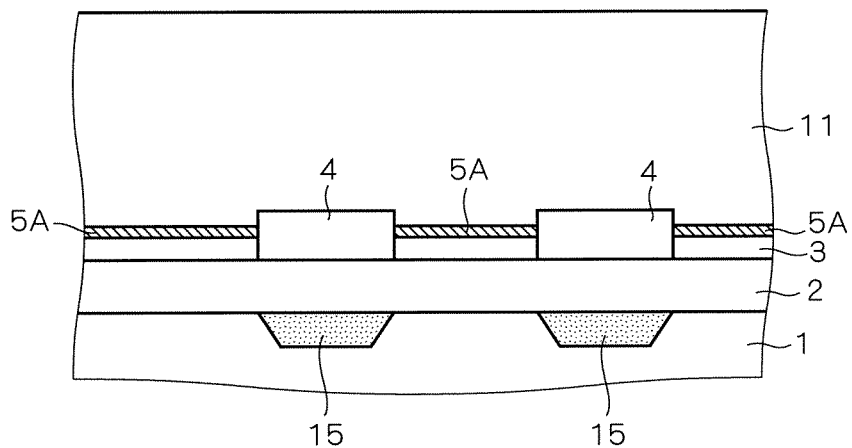

In FIG. 21, first, the silicide layer 5A is also formed in the guard ring part along with the step of forming the silicide regions 6 in the transistor forming region. Then, the first interlayer insulation film 11 is formed to cover the guard ring part, NMOS part and the like.

Figure 22:
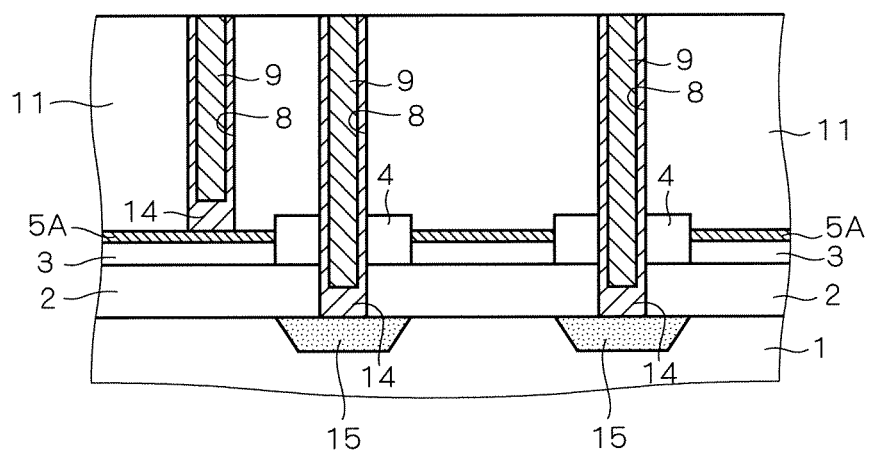

In FIG. 22, the first interlayer insulation film 11, isolation oxide films 4 and BOX oxide film 2 are etched to form contact holes 8 reaching the highly-doped semiconductor layers 15. A contact hole 8 reaching the silicide layer 5A is also formed. Then, the contact holes 8 are each completely filled with the barrier metal 14 and plug 9.

The following steps will be described referring to FIG. 6 and corresponding description in the fourth preferred embodiment.

In opening the contact holes 8, a typical contact opening mask for opening on the SOI layer 3 may also be used, or another mask dedicated to forming the contact holes 8 may be used.

Ion implantation may be carried out on the supporting substrate 1 after forming the contact holes 8 reaching the highly-doped semiconductor layers 15.

Forming the wiring materials 12B-12H, wire 13 and the like allows the potential of the supporting substrate 1 to be fixed.

A matter of importance is that the components of the guard ring part, i.e., the plurality of highly-doped semiconductor layers 15, plurality of isolation oxide films 4, plurality of contact holes 8, plurality of first wiring materials (9, 14), plurality of wires 10, 10C, 10E and 10G, plurality of second wiring materials 12B, 12D, 12F and 12H and uppermost wire 13 all extend in the first to fourth directions D1 to D4, to thereby surround the entire transistor forming region TR.

Sixth Preferred Embodiment

The present embodiment relates to a method of manufacturing the semiconductor device according to the third preferred embodiment, and more particularly to a method of manufacturing the guard ring part described in the third preferred embodiment. Hereinafter, the method of manufacturing the guard ring part will be described in terms of steps different from those of the fourth preferred embodiment, while steps of manufacturing the NMOS part and PMOS part in the transistor forming region will be omitted. FIGS. 10A, 11A and 12A will thus be mentioned.

Figure 23:
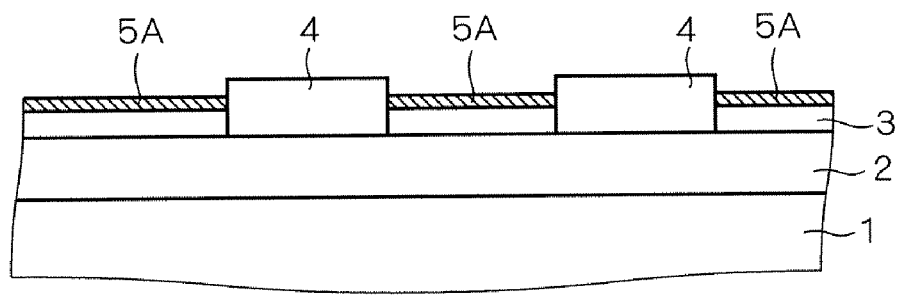
FIGS. 23-28 are vertical sectional views showing manufacturing steps of a semiconductor device according to a sixth preferred embodiment.

In FIG. 23, the silicide layer 5A is also formed on the SOI layer 3 in the guard ring part along with the step of forming the silicide regions in the NMOS part and PMOS part in the transistor forming region.

Figure 24:
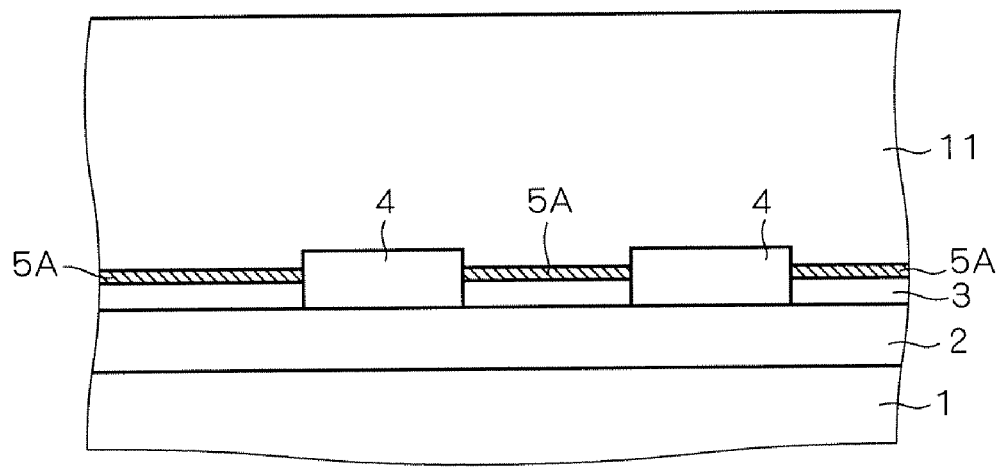

In FIG. 24, the isolation oxide films 4 and silicide layer 5A are entirely covered with the first interlayer insulation film 11 formed not only in the guard ring part but also in the NMOS part and PMOS part.

Figure 25:
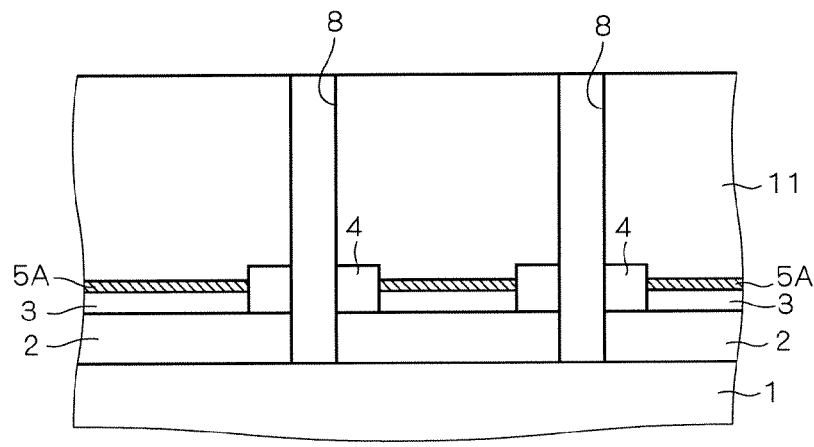

In FIG. 25, contact holes 8 are formed by etching to extend through the first interlayer insulation film 11, isolation oxide films 4 and BOX oxide film 2. The bottom of the contact holes 8 corresponds to the upper surface of the supporting substrate 1.

Figure 26:
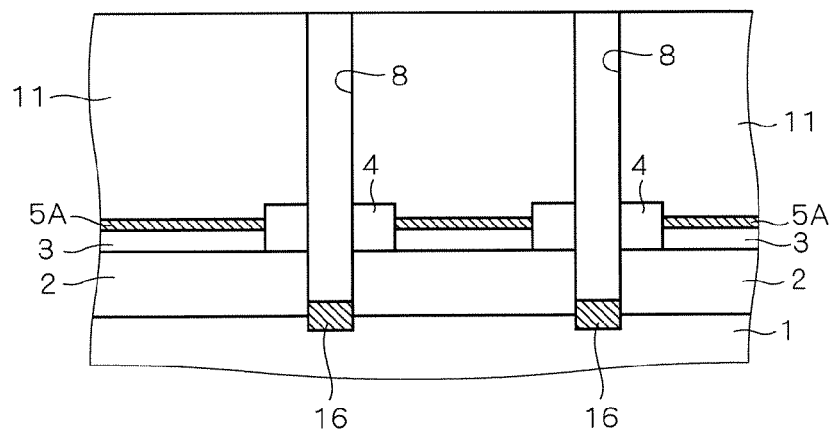

In FIG. 26, silicide layers 16 are formed on the bottom of the contact holes 8.

Figure 27:
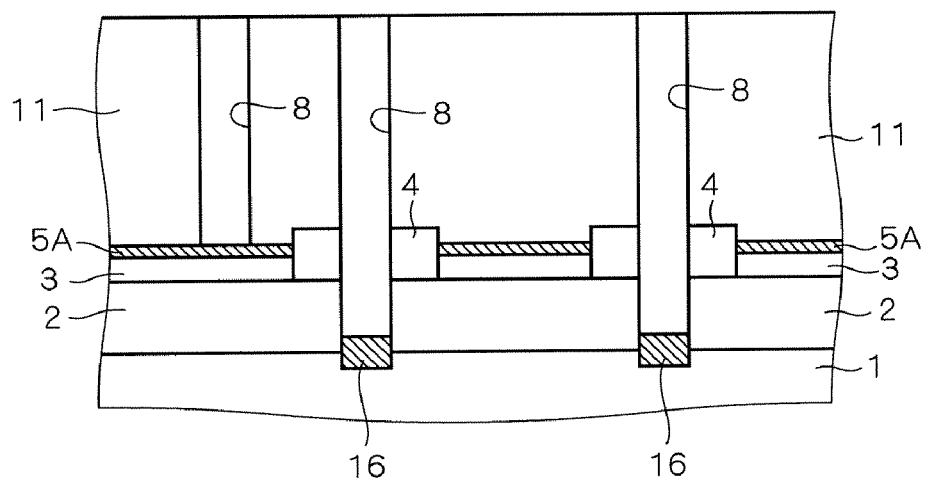

In FIG. 27, a contact hole 8 reaching the upper surface of the silicide layer 5A in the guard ring part is formed in the first interlayer insulation film 11 along with the step of forming the contact holes in the NMOS part and PMOS part.

Figure 28:
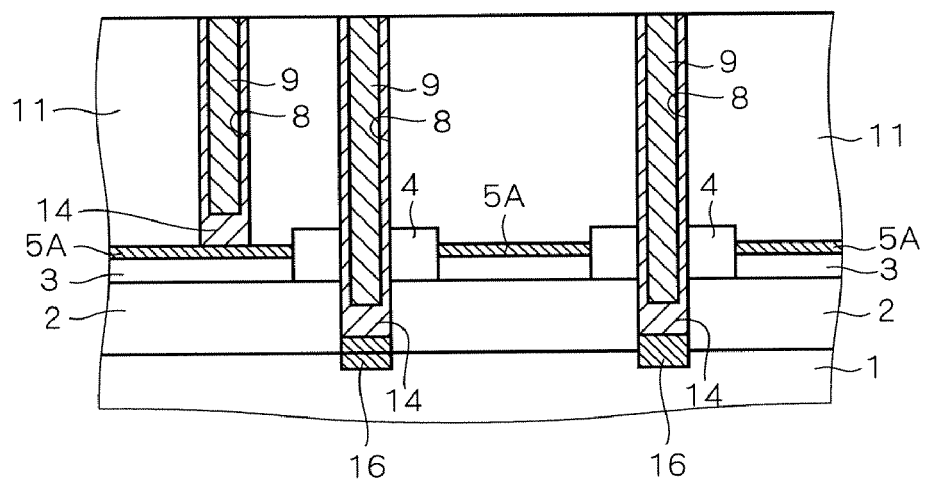

In FIG. 28, the barrier metal 14 is formed in each of the contact holes 8, and then, the contact holes 8 are each completely filled with the plug 9.

The subsequent steps are as shown in FIG. 8 and described in the fourth preferred embodiment.

In opening the contact holes 8, a typical contact opening mask for opening on the SOI layer 3 may also be used, or another mask dedicated to forming the contact holes 8 may be used.

Ion implantation may be carried out on the supporting substrate 1 after forming the contact holes 8 reaching the supporting substrate 1.

Forming the wiring materials 12B-12H, wire 13 and the like allows the potential of the supporting substrate 1 to be fixed.

A matter of importance is that the components of the guard ring part, i.e., the plurality of isolation oxide films 4, plurality of contact holes 8, plurality of silicide layers 16, plurality of first wiring materials 9, 14, plurality of wires 10, 10C, 10E and 10G, plurality of second wiring materials 12B, 12D, 12F and 12H and uppermost wire 13 all extend in the first to fourth directions D1 to D4, to thereby surround the entire transistor forming region TR in the SOI wafer.

Note

Figure 29:
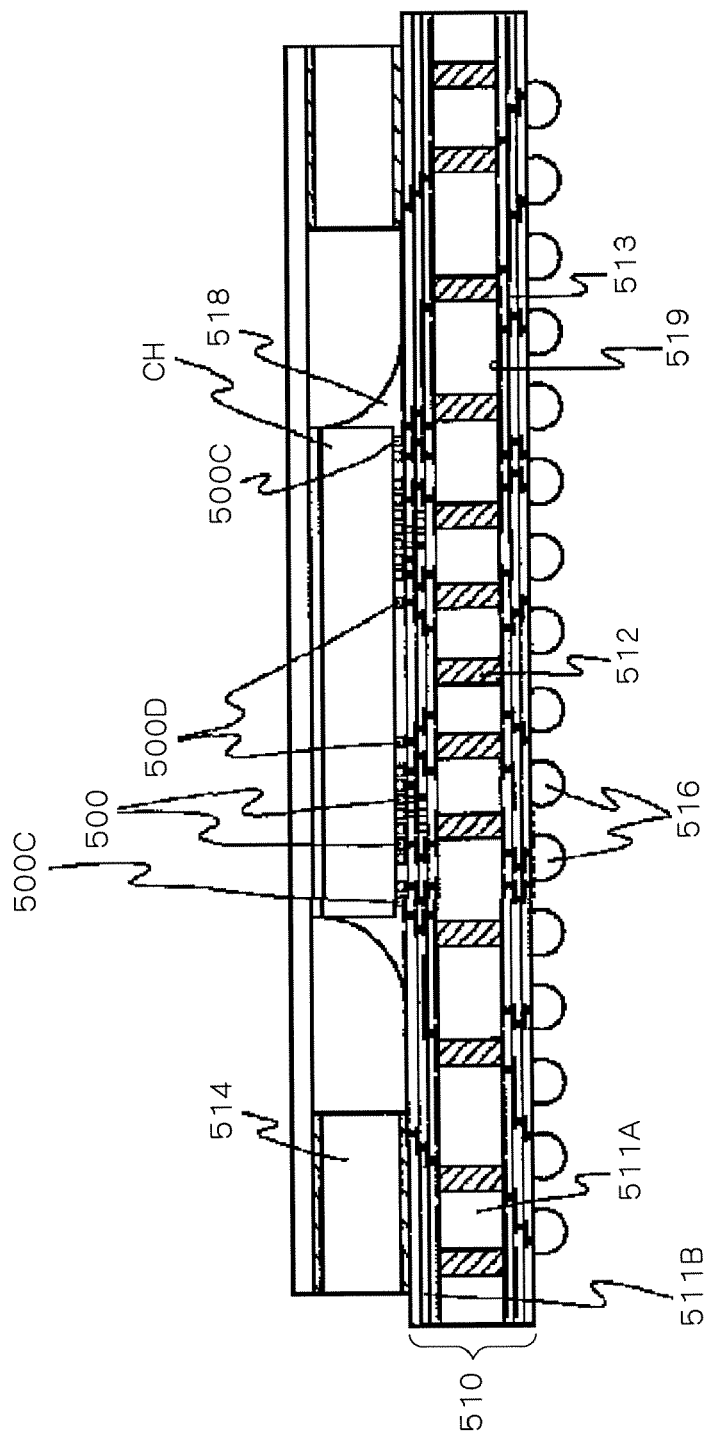
FIG. 29 is a vertical sectional view schematically illustrating an embodiment of mounting the semiconductor chip according to any one of the first to third preferred embodiments on a substrate by FC technique.

The vertical sectional view of FIG. 29 illustrates an embodiment of assembly when mounting the semiconductor chip CH (FIG. 1) having SOI structure according to any one of the first to third preferred embodiments on a substrate by the FC technique. In the semiconductor device shown in FIG. 29, the reference character 500 denotes a solder bump, 500C denotes the outermost solder bump, 500D denotes the innermost solder bump, 510 denotes a BGA substrate, 511B denotes a build-up insulation layer, 511A denotes a core material, 514 denotes a ring, 512 denotes a via hole, 516 denotes a solder ball, 519 denotes a wire, 513 denotes an insulation layer, and 518 denotes a sealing material. As illustrated, the supporting substrate on the rear surface side of the semiconductor chip CH positioned upward in the drawing is fixed to a certain potential (e.g., ground potential) by the aforementioned structure, without particularly using wires.

Figure 30:
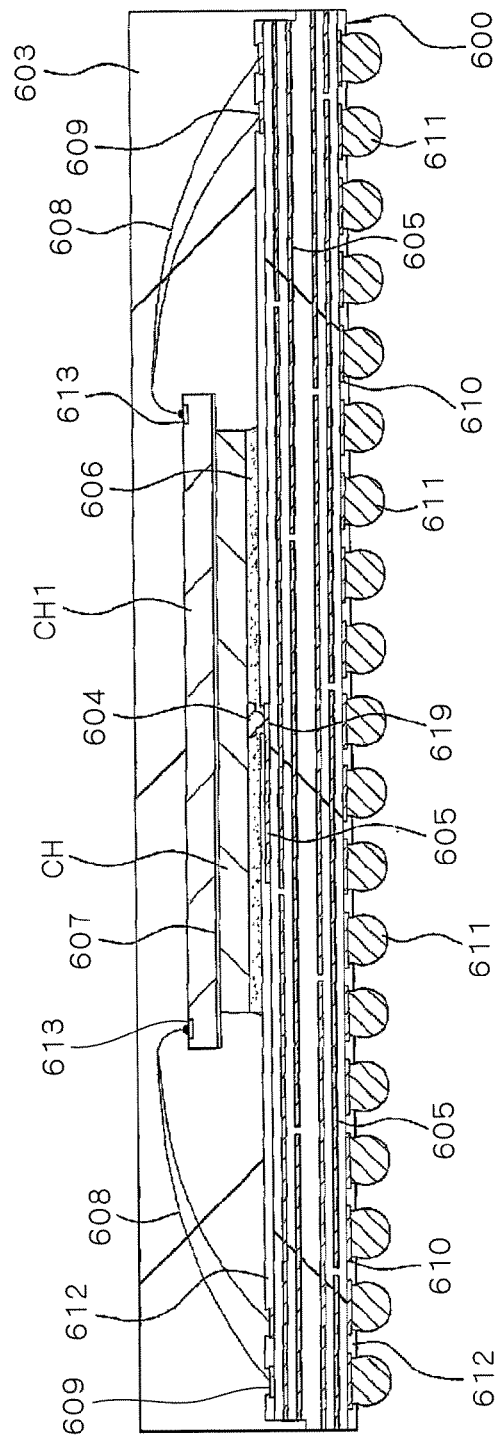
FIG. 30 is a vertical sectional view schematically illustrating another embodiment of mounting the semiconductor chip according to any one of the first to third preferred embodiments on a substrate by FC technique.

The vertical sectional view of FIG. 30 illustrates another embodiment of assembly when mounting the semiconductor chip CH (FIG. 1) having SOI structure according to any one of the first to third preferred embodiments on a substrate by the FC technique. In the semiconductor device shown in FIG. 30, another semiconductor chip CH1 having a different structure from the semiconductor chip CH is mounted on the semiconductor chip CH mounted on the substrate by the FC technique with an adhesive 607 applied therebetween. In FIG. 30, the reference character 600 denotes a package substrate, 603 denotes a mold resin, 604 denotes an Au bump, 605 denotes a wire, 606 denotes a resin, 608 denotes a wire, 609, 613 and 619 denote bonding pads, 610 denotes an electrode pad, 611 denotes a solder bump, and 612 denotes an insulation film. In the semiconductor device shown in FIG. 30, the supporting substrate on the rear surface side of the semiconductor chip CH is also fixed to a certain potential (e.g., ground potential) by the aforementioned structure, without particularly using wires.

While the invention has been shown and described in detail, the foregoing description is in all aspects illustrative and not restrictive. It is therefore understood that numerous modifications and variations can be devised without departing from the scope of the invention.

The present invention is suitable for application to a semiconductor device employing a SOI wafer.

What is claimed is:

1. A semiconductor device including a semiconductor supporting substrate, an insulation film layer formed on said semiconductor supporting substrate and a transistor formed on a semiconductor layer formed on said insulation film layer, comprising:
    an isolation oxide film formed in said semiconductor layer;
    an interlayer insulation film formed on said semiconductor layer and said isolation oxide film;
    a wiring layer formed on said interlayer insulation film; and
    a conductive layer connecting said semiconductor supporting substrate and said wiring layer and fixing a potential of said semiconductor supporting substrate,
    wherein
    said conductive layer and said wiring layer are formed around a periphery of a region in which said transistor is to be formed and a silicide layer formed on a bottom of a first opening extending through said isolation oxide film, said semiconductor layer and said insulation film layer to reach said semiconductor supporting substrate; a conductive layer filling a second opening extending through a first interlayer insulation film formed on said semiconductor layer and said isolation oxide film to reach said silicide layer; and a wiring layer connected to said conductive layer,
    said conductive layer filling said second opening and said semiconductor layer are connected.

2. The semiconductor device according to claim 1, wherein said first opening has a width smaller than twice a thickness of said first interlayer insulation film filling said first opening.

3. A semiconductor device including a semiconductor supporting substrate, an insulation film layer formed on said semiconductor supporting substrate and a transistor formed on a semiconductor layer formed on said insulation film layer, comprising:
    an isolation oxide film formed in said semiconductor layer;
    an interlayer insulation film formed on said semiconductor layer and said isolation oxide film;
    a wiring layer formed on said interlayer insulation film; and
    a conductive layer connecting said semiconductor supporting substrate and said wiring layer and fixing a potential of said semiconductor supporting substrate;
    a highly-doped semiconductor layer formed in said semiconductor supporting substrate under an opening extending through said isolation oxide film;
    a first interlayer insulation film formed on said isolation oxide film to reach said semiconductor supporting substrate; and
    a conductive layer filling said opening,
    wherein
    said conductive layer and said wiring layer are formed around a periphery of a region in which said transistor is to be formed;
    said wiring layer is connected to said conductive layer; and
    said conductive layer filling said opening and said semiconductor layer are connected.

4. A semiconductor device including a semiconductor supporting substrate, an insulation film layer formed on said semiconductor supporting substrate and a transistor formed on a semiconductor layer formed on said insulation film layer, comprising:
    an isolation oxide film formed in said semiconductor layer;
    an interlayer insulation film formed on said semiconductor layer and said isolation oxide film;
    a wiring layer formed on said interlayer insulation film;
    a conductive layer connecting said semiconductor supporting substrate and said wiring layer and fixing a potential of said semiconductor supporting substrate;
    a silicide layer formed on a bottom of an opening extending through said isolation oxide film; and
    a first interlayer insulation film formed on said isolation oxide film to reach said semiconductor supporting substrate,
    wherein
    said conductive layer and said wiring layer are formed around a periphery of a region in which said transistor is to be formed;
    a conductive layer fills said opening;
    said wiring layer is connected said conductive layer; and
    said conductive layer filling said second opening and said semiconductor layer are connected.

5. A method of manufacturing a semiconductor device, comprising the steps of:
    forming an isolation insulation film isolating a semiconductor layer formed on a supporting substrate with an insulation film layer interposed therebetween, around a transistor forming region in which a transistor is to be formed in said semiconductor layer;
    forming a first opening extending through said insulation film layer directly under said isolation insulation film to reach said supporting substrate;

forming a silicide layer on said supporting substrate corresponding to a bottom of said first opening;

forming a first interlayer insulation film layer inside and above said first opening;

forming a second opening in said first opening, said second opening extending through said first interlayer insulation film layer, with the bottom of said second opening corresponding to a surface of said silicide layer;

forming a first conductive layer filling said second opening, to an upper surface of said first interlayer insulation film layer;

forming a first wiring layer connected onto said first conductive layer;

forming a second interlayer insulation film layer around said first wiring layer; and forming, in one or a plurality of layers, a conductive layer connected onto said first wiring layer, a wiring layer connected onto the conductive layer and an interlayer insulation film layer around said wiring layer, wherein said first conductive layer, said first wiring layer, said conductive layer and said wiring layer connected to one another are formed around said transistor forming region.

6. A semiconductor device including a semiconductor supporting substrate, an insulation film layer formed on said semiconductor supporting substrate and a transistor formed on a semiconductor layer formed on said insulation film layer, comprising:

an isolation oxide film formed in said semiconductor layer;

an interlayer insulation film formed on said semiconductor layer and said isolation oxide film;

a wiring layer formed on said interlayer insulation film;

a conductive layer connecting said semiconductor supporting substrate and said wiring layer and fixing a potential of said semiconductor supporting substrate;

a plurality of said interlayer insulation films and a plurality of said wiring layers;

a conductive layer connecting said semiconductor supporting substrate and an uppermost wiring layer;

a plurality of said conductive layers and a plurality of said wiring layers around the periphery of said region in which said transistor is to be formed;

a silicide layer located on said semiconductor layer; and a second conductive layer connecting said uppermost wiring layer and said silicide layer, wherein said second conductive layer does not reach said semiconductor support substrate, and is formed around a periphery of a region in which said transistor is to be formed.

* * * * *